United States Patent
Wu et al.

(10) Patent No.: US 6,946,678 B2
(45) Date of Patent: Sep. 20, 2005

(54) TEST KEY FOR VALIDATING THE POSITION OF A WORD LINE OVERLAYING A TRENCH CAPACITOR IN DRAMS

(75) Inventors: Tie Jiang Wu, Ilan Hsien (TW); Chien-Chang Huang, Banchiau (TW); Yu-Wei Ting, Taipei (TW); Bo Ching Jiang, Hualien Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 17 days.

(21) Appl. No.: 10/902,450

(22) Filed: Jul. 29, 2004

(65) Prior Publication Data

US 2005/0002221 A1 Jan. 6, 2005

Related U.S. Application Data

(62) Division of application No. 10/601,386, filed on Jun. 23, 2003, now Pat. No. 6,825,053.

(30) Foreign Application Priority Data

Aug. 16, 2002 (TW) .................................. 91118520 A

(51) Int. Cl.[7] ............................................. H01L 23/58
(52) U.S. Cl. ........................................................ 257/48
(58) Field of Search ............................ 257/48, 301–305; 438/242, 243, 386

(56) References Cited

U.S. PATENT DOCUMENTS

| | | | | | |
|---|---|---|---|---|---|
| 5,914,512 | A | * | 6/1999 | Huang | 257/306 |
| 6,310,361 | B1 | * | 10/2001 | Lichter | 257/48 |
| 6,339,228 | B1 | * | 1/2002 | Iyer et al. | 257/48 |
| 6,812,487 | B1 | * | 11/2004 | Wu et al. | 257/48 |
| 6,838,296 | B2 | * | 1/2005 | Wu et al. | 438/14 |

* cited by examiner

Primary Examiner—Hung Vu
(74) Attorney, Agent, or Firm—Quintero Law Office

(57) ABSTRACT

A test key for validating the position of a word line structure overlaying a deep trench capacitor of a DRAM. The test key is deposited in the scribe line region of a wafer. The deep trench capacitor is deposited in the scribe line region and has a buried plate. A rectangular word line is deposited in the scribe line and covers a portion of the deep trench capacitor, and two passing word lines are deposited above the deep trench. A first doping region and a second doping region are deposited between the rectangular word line and the first passing word line and between the rectangular word line and the second passing word line respectively. A first plug, a second plug and a third plugs are coupled to the first doping region, the second doping region and the buried plate respectively.

5 Claims, 5 Drawing Sheets

TEST KEY FOR VALIDATING THE POSITION OF A WORD LINE OVERLAYING A TRENCH CAPACITOR IN DRAMS

This application is a divisional of U.S. application Ser. No. 10/6011,386, filed Jun. 23, 2003 now U.S. Pat. No. 6,825,053.

BACKGROUND OF THE INVENTION

1. Field of the Invention

The present invention relates to a test key and particularly to a test key and method for validating the position of a word line structure overlaying the deep trench capacitor in a DRAM.

2. Description of the Prior Art

The essential charge storage devices in a DRAM (Dynamic Random Access Memory) are frequently implemented by trench capacitors. The trench capacitor is formed in the substrate and has a capacitance proportional to the depth of the trench. That is to say, by increasing the depth of the trench, which results in a larger surface area of the "plates", the trench capacitor provides a higher capacitance.

FIG. 1 is a diagram showing the layout of a conventional DRAM. A trench capacitor 10 is disposed beneath the passing word line. A transistor 14 is coupled to a node 16 of the trench capacitor 10 through a diffusion region 18. A diffusion region 20 is coupled to a plug 22. The plug 22 is coupled to a bit line (not shown). Thus, data is read from or written into the trench capacitor 10 through the node 16 by operation of the transistor 14. The transistor 14 is controlled by voltages on the word line 12. When a high voltage level is on the word line 12, a conductive channel is formed below the word line 12 so that a current flows from or to the node 16 through the diffusion regions 18 and 20, whereby the data is read from or written into the capacitor 10.

FIG. 2 shows a cross section along the line AA in FIG. 1. An STI (Shallow Trench Isolation) 28 is formed in the substrate and trench capacitor to define an active area and isolate the trench capacitor 10 from the word line 12 formed later. After formation of the word line 12, the diffusion regions 18 and 20, used as a source and drain, on two sides of the word line 12 are formed by ion implantation with masking of the word line 12 and STI 28. Thus, the position of the word line 12 overlaying the trench capacitor 10 has great impact on the profiles of the source and drain. For the DRAM having trench capacitors used as storage devices, an improper overlay of the word line and capacitor results in current leakage between adjacent memory cells or even defective cells. Validating the position of the word line is an essential step for DRAM manufacturing.

SUMMARY OF THE INVENTION

The object of the present invention is to provide a test key and method for validating the position of a word line structure overlaying the deep trench capacitor in a DRAM.

The present invention provides a test key for validating the position of a word line overlaying a trench capacitor, which is deposited in a scribe line region of a wafer, the test key comprises a trench capacitor deposited in the scribe line region and has a buried plate, a rectangular word line deposited in the scribe line region and covers a portion of the trench capacitor, a first and second passing word line deposited above the trench capacitor, a first and second doping region respectively deposited between the rectangular word line and the first passing word line, and the rectangular word line and the second passing word line, a first plug coupled to the first doping region, a second plug coupled to the second doping region, and a third plug coupled to the buried plate.

The present invention further provides a method for validating the position of a word line overlaying a trench capacitor, comprising the steps of providing a wafer having at least one scribe line region and a memory cell region, forming a test key in the scribe line region and a plurality of memory cells in the memory cell region, wherein the test key comprises a trench capacitor deposited in the scribe line region and has a buried plate, a rectangular word line deposited in the scribe line region and covers a portion of the trench capacitor, a first and second passing word line deposited above the trench capacitor, a first and second doping region respectively deposited between the rectangular word line and the first passing word line, and the rectangular word line and the second passing word line, a first plug coupled to the first doping region, a second plug coupled to the second doping region, and a third plug coupled to the buried plate, measuring a first current between the first and third plug resulting from applying a predetermined voltage difference between the first and third plug, applying a predetermined voltage level on the rectangular word line and floating the second plug, and a second current between the second and third plug resulting from applying the predetermined voltage difference between the second and third plug, applying the predetermined voltage level on the rectangular word line and floating the first plug, and validating the position of the rectangular word line by the measured first and second currents.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 3:
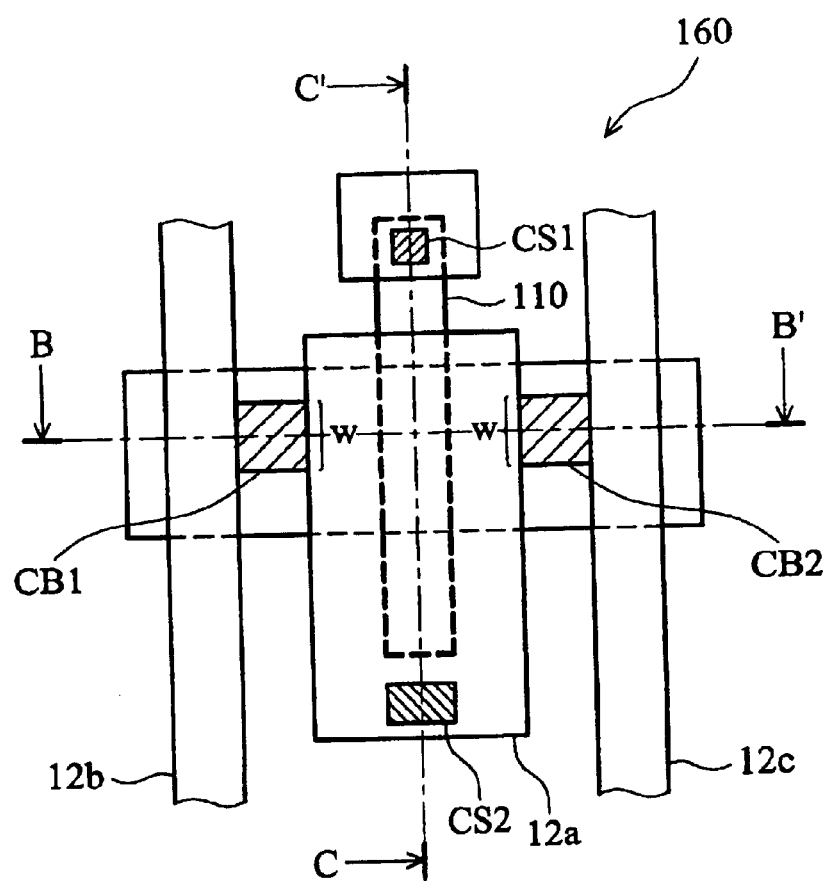
FIG. 3 shows the layout of a test key for validating the position of the word line structure overlaying the deep trench capacitors in a DRAM according to one embodiment of the invention.
Figure 4A:
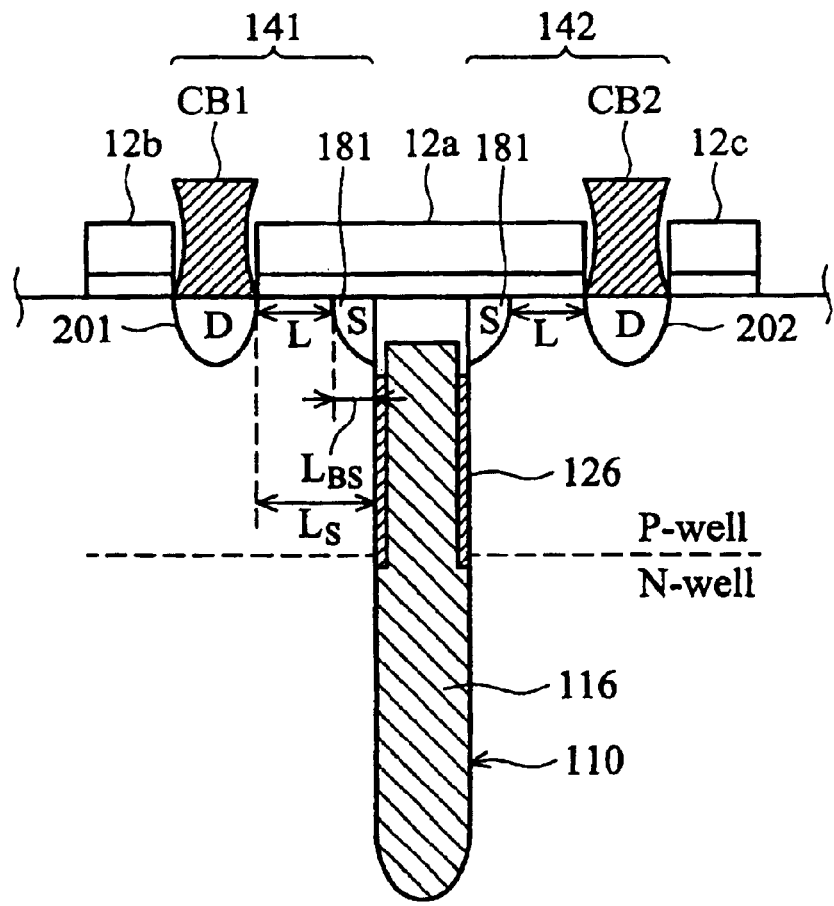
FIG. 4a shows a cross section along the line BB' in FIG. 3.
Figure 4B:
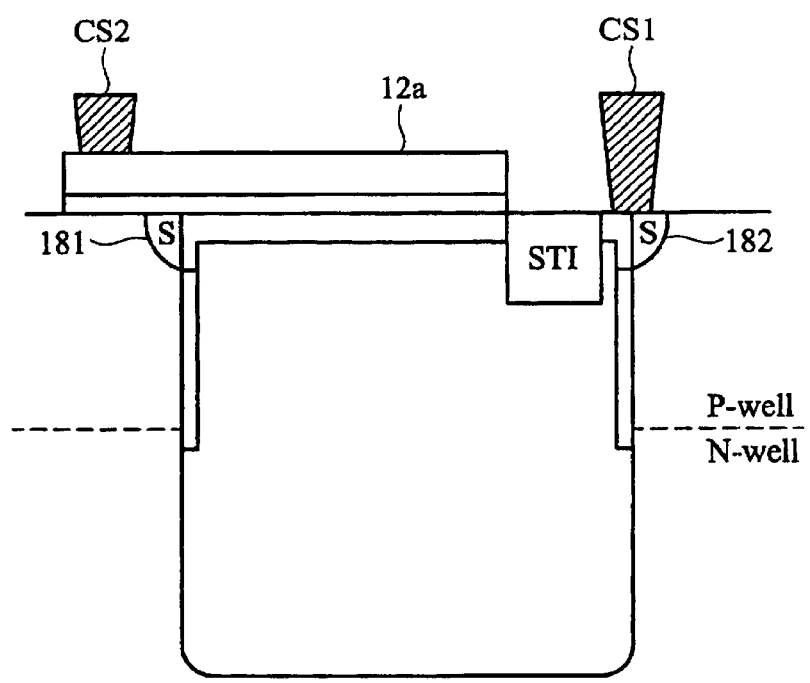
FIG. 4b shows a cross section along the line CC' in FIG. 3.

FIG. 3 shows the layout of a test key for validating the position of the word line structure overlaying the deep trench capacitors in a DRAM according to one embodiment of the invention. FIGS. 4a and 4b show cross sections along the line BB' and CC' in FIG. 3.

A trench capacitor 110 is formed in the scribe line region 160 of a wafer 100. The trench capacitor 110 includes a storage node 11b, buried plates 181 in a buried N well and a dielectric layer therebetween. The storage node 11b is isolated from the P well by a collar oxide 126.

A rectangular word line 12a, and passing word lines 12b and 12c are disposed on the scribe line region 160. The rectangular word line 12a overlaps part of the deep trench capacitor 110 while the passing word lines 12b and 12c are located above the deep trench capacitor 110. The widths of the passing word lines 12b and 12c are substantially the same and are 0.6 μm approximately, which is smaller than that of the rectangular word line 12a, 0.6 μm approximately.

By ion implantation, doping regions 201 and 202 are respectively formed between the rectangular word line 12a and passing word line 12b, and the passing word lines 12b and 12c, as shown in FIG. 4a.

Referring to FIGS. 4a and 4b, it is noted that the buried plates 181, doping regions 201 and 202, and rectangular word line 12a form two transistors 141 and 142. The gate, source and drain of the transistor 141 are respectively the rectangular word line 12a, buried plate 181 and doping region 201 while those of the transistor 142 are respectively the rectangular word line 12a, buried plate 181 and doping region 202.

For validating the position of the word line structure using the test key, currents I1 and I2 respectively between the plugs CS1 and CB1, and CS1 and CS2 are measured under specific bias configurations.

The current I1 results from applying a predetermined bias voltage Vbias to the rectangular word line 12a, applying a voltage difference VDC between the plugs CS1 and CB1, and floating the plug CS2. The magnitude of the current I1 is derived by the following equation:

$$I1 = C*W1/(Ls1-Lbs1+\Delta L) \quad (1),$$

where W1 is the width of the plug CB1, Lbs1 is the diffusion distance of the buried plate 181, ΔL is the misaligned distance of the rectangular word line 12a, Ls is the distance between the region 201 and trench capacitor 110, and C is a constant.

The current I2 results from applying the predetermined bias voltage Vbias to the rectangular word line 12a, applying the voltage difference VDC between the plugs CS1 and CS2, and floating the plug CS1. The magnitude of the current I2 is derived by the following equation:

$$I2 = C*W2/(Ls2-Lbs2+\Delta L) \quad (2),$$

where W2 is the width of the plug CB2, Lbs2 is the diffusion distance of the buried plate 181, ΔL is the misaligned distance of the rectangular word line 12a, Ls2 is the distance between the region 202 and trench capacitor 110, and C is a constant.

Since the transistors 141 and 142 are formed by processing steps using the same parameters, the widths W1 and W2 of the plugs CB1 and CB2 are the same and represented by W, the diffusion distances of all the buried plates 181 are the same and represented by Lbs, and the distances Ls1 and Ls2 are also the same and represented by Ls. Thus, from the equations (1) and (2), the ratio I1/I2 and ΔL are derived by the following equations.

$$I1/I2 = (Ls-Lbs+\Delta L)/(Ls-Lbs-\Delta L) \quad (3)$$

$$\Delta L = (Lbs-Ls)*(I1-I2)/(I1+I2) \quad (4)$$

Accordingly, there is no misalignment (ΔL=0) only if the currents I1 and I2 are substantially the same. On the other hand, if there is a significant difference between the magnitudes of the currents I1 and I2, the misaligned distance of the rectangular word line 12a can be derived by the equation (4). The current I1 is smaller than I2 if the word lines 12a, 12b and 12c are improperly close to the transistor 141 while the current I1 is larger than I2 if the word lines 12a, 12b and 12c are improperly close to the transistor 142.

The method for validating the position of a word line structure within a deep trench capacitor in a DRAM according to one embodiment of the invention is described in the following.

First, a wafer having at least one scribe line region and a memory cell region is provided.

Figure 1:
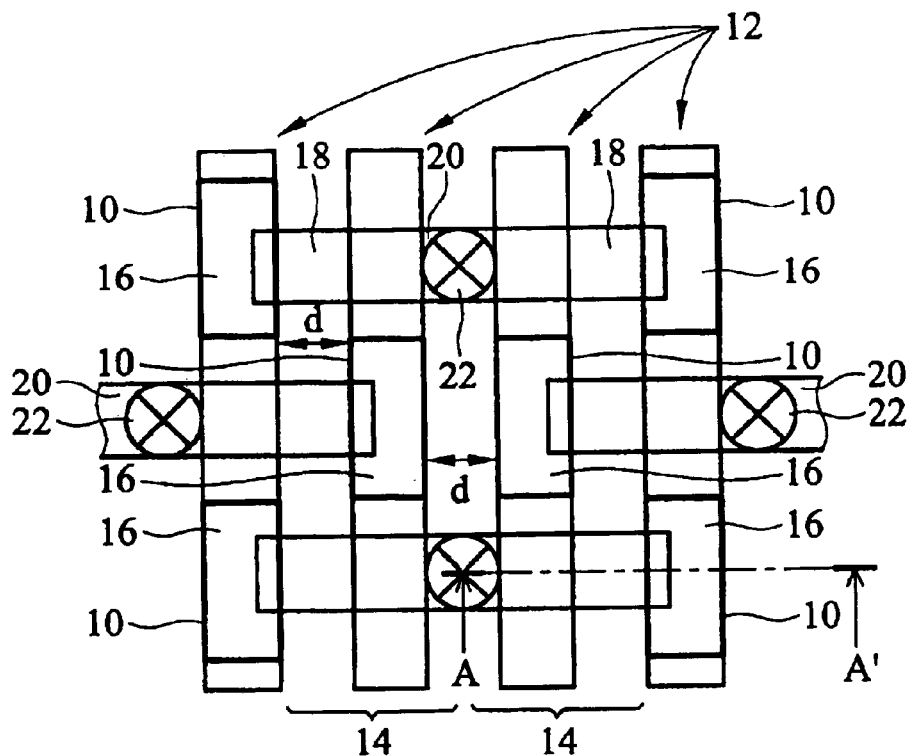
FIG. 1 shows the layout of a conventional DRAM.
Figure 2:
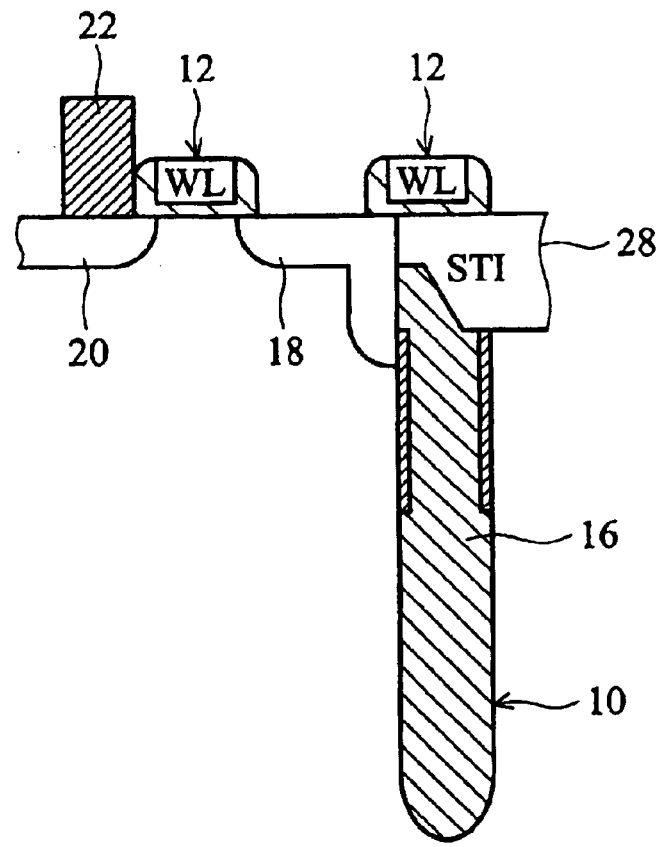
FIG. 2 shows a cross section along the line AA in FIG. 1.

Second, a test key, as shown in FIG. 3, is formed in the scribe line region and a plurality of memory cells, as shown in FIGS. 1 and 2 are formed in the memory cell region.

Third, currents I1 and I2 respectively between the plugs CS1 and CB1, and CS1 and CS2 are measured under specific bias configurations. The current I1 results from applying a predetermined bias voltage Vbias to the rectangular word line 12a, applying a voltage difference VDC between the plugs CS1 and CB1, and floating the plug CS2. The current I2 results from applying the predetermined bias voltage Vbias to the rectangular word line 12a, applying the voltage difference VDC between the plugs CS1 and CS2, and floating the plug CS1.

Finally, the misalignment of the rectangular word line 12a is detected by the magnitudes of the currents I1 and I2 according to the previously described equations (3) and (4). There is no misalignment (ΔL=0) only if the currents I1 and I2 are substantially the same. On the other hand, if there is a significant difference between the magnitudes of the currents I1 and I2, the misaligned distance of the rectangular word line 12a can be derived by the equation (4). The current I1 is smaller than I2 if the word lines 12a, 12b and 12c are improperly close to the transistor 141 while the current I1 is larger than I2 if the word lines 12a, 12b and 12c are improperly close to the transistor 142.

Since the positions of the word lines of the test key and memory cells are "interlocked", validating the position of the word line structure used in the memory cells can be also implemented by measurement of the currents I1 and I2.

In conclusion, the present invention provides a test key and method for validating the position of the word line structure overlaying the deep trench capacitors in a DRAM. The validity of the word line position is determined by current measurement. This achieves rapid validation without occupying part of the memory cell region by the test key which is disposed in the scribe line region of the wafer.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A test key for validating the position of a word line overlaying a trench capacitor, which is deposited in a scribe line region of a wafer, the test key comprising:

a trench capacitor with a buried plate is deposited in the scribe line region;

a rectangular word line deposited in the scribe line region, covering a portion of the trench capacitor;

a first and second passing word line deposited above the trench capacitor;

a first and second doping region respectively deposited between the rectangular word line and the first passing word line, and the rectangular word line and the second passing word line;

a first plug coupled to the first doping region;

a second plug coupled to the second doping region; and a third plug coupled to the buried plate.

2. The test key as claimed in claim 1 further comprising a fourth plug coupled to the rectangular word line.

3. The test key as claimed in claim 1, wherein the position of the rectangular word line is validated by measuring a first current between the first and third plug resulting from applying a predetermined voltage difference between the first and third plug, applying a predetermined voltage level on the rectangular word line and floating the second plug, and a second current between the second and third plug resulting from applying the predetermined voltage difference between the second and third plug, applying the predetermined voltage level on the rectangular word line and floating the first plug.

4. The test key as claimed in claim 1, wherein widths of the first and second passing word lines are substantially the same, and substantially smaller than a width of the rectangular word line.

5. The test key as claimed in claim 1, wherein a width of the rectangular word line is approximately 0.6 $\mu$m.

* * * * *